(12) United States Patent
Lin

(10) Patent No.: US 7,709,964 B2
(45) Date of Patent: *May 4, 2010

(54) STRUCTURE OF A MICRO ELECTRO MECHANICAL SYSTEM AND THE MANUFACTURING METHOD THEREOF

(75) Inventor: Wen-Jian Lin, Taiwan (CN)

(73) Assignee: QUALCOMM, Inc., San Diego, CA (US)

( * ) Notice: Subject to any disclaimer, the term of this patent is extended or adjusted under 35 U.S.C. 154(b) by 200 days.

This patent is subject to a terminal disclaimer.

(21) Appl. No.: 11/925,551

(22) Filed: Oct. 26, 2007

(65) Prior Publication Data

US 2008/0055699 A1 Mar. 6, 2008

Related U.S. Application Data

(63) Continuation of application No. 10/810,660, filed on Mar. 29, 2004, now Pat. No. 7,291,921.

(30) Foreign Application Priority Data

Sep. 30, 2003 (CN) .................. 92 1 27100

(51) Int. Cl.
*H01L 29/40* (2006.01)
(52) U.S. Cl. .................. 257/773; 257/80; 257/415; 438/69; 359/245
(58) Field of Classification Search ............ 257/773, 257/415, 80; 438/69; 359/245, 291, 254
See application file for complete search history.

(56) References Cited

U.S. PATENT DOCUMENTS

| 4,566,935 A | 1/1986 | Hornbeck |
| 4,710,732 A | 12/1987 | Hornbeck |
| 4,859,060 A | 8/1989 | Katagiri et al. |
| 4,956,619 A | 9/1990 | Hornbeck |

(Continued)

FOREIGN PATENT DOCUMENTS

CN 092109265 4/2003

(Continued)

OTHER PUBLICATIONS

Fan et al., "Channel Drop Filters in Photonic Crystals," Optics Express, vol. 3, No. 1 (1998).

(Continued)

*Primary Examiner*—Jarrett J Stark
(74) *Attorney, Agent, or Firm*—Knobbe Martens Olson & Bear LLP

(57) ABSTRACT

A structure of a micro electro mechanical system and a manufacturing method are provided, the structure and manufacturing method is adapted for an optical interference display cell. The structure of the optical interference display cell includes a first electrode, a second electrode and posts. The second electrode comprises a conductive layer covered by a material layer and is arranged about parallel with the first electrode. The support is located between the first plate and the second plate and a cavity is formed. In the release etch process of manufacturing the structure, the material layer protects the conductive layer from the damage by an etching reagent. The material layer also protects the conductive layer from the damage from the oxygen and moisture in the air.

22 Claims, 7 Drawing Sheets

U.S. PATENT DOCUMENTS

| | | | |
|---|---|---|---|
| 5,233,456 A | 8/1993 | Nelson | |
| 5,287,215 A | 2/1994 | Warde et al. | |
| 5,454,906 A | 10/1995 | Baker et al. | |
| 5,497,262 A | 3/1996 | Kaeriyama | |
| 5,526,172 A | 6/1996 | Kanack | |
| 5,600,383 A | 2/1997 | Hornbeck | |
| 5,606,441 A | 2/1997 | Florence et al. | |
| 5,631,782 A | 5/1997 | Smith et al. | |
| 5,646,768 A | 7/1997 | Kaeriyama | |
| 5,650,881 A | 7/1997 | Hornbeck | |
| 5,673,139 A | 9/1997 | Johnson | |
| 5,745,281 A | 4/1998 | Yi et al. | |
| 5,751,469 A | 5/1998 | Arney et al. | |
| 5,783,864 A | 7/1998 | Dawson et al. | |
| 5,784,212 A | 7/1998 | Hornbeck | |
| 5,808,781 A | 9/1998 | Arney et al. | |
| 5,824,608 A | 10/1998 | Gotoh et al. | |
| 5,825,528 A | 10/1998 | Goossen | |
| 5,835,255 A | 11/1998 | Miles | |
| 5,838,484 A | 11/1998 | Goossen et al. | |
| 5,867,302 A | 2/1999 | Fleming et al. | |
| 5,914,803 A | 6/1999 | Hwang et al. | |
| 5,920,421 A | 7/1999 | Choi | |
| 5,998,293 A | 12/1999 | Dawson et al. | |
| 6,038,056 A | 3/2000 | Florence et al. | |
| 6,040,937 A | 3/2000 | Miles | |
| 6,100,477 A | 8/2000 | Randall et al. | |
| 6,284,560 B1 | 9/2001 | Jech et al. | |
| 6,358,021 B1 | 3/2002 | Cabuz | |
| 6,447,126 B1 | 9/2002 | Hornbeck | |
| 6,465,355 B1 | 10/2002 | Horsley | |
| 6,574,033 B1 | 6/2003 | Chui et al. | |
| 6,602,791 B2 | 8/2003 | Ouellet et al. | |
| 6,618,187 B2 | 9/2003 | Pilossof | |
| 6,632,698 B2 | 10/2003 | Ives | |
| 6,650,455 B2 | 11/2003 | Miles | |
| 6,657,832 B2 | 12/2003 | Williams et al. | |
| 6,674,562 B1 | 1/2004 | Miles | |
| 6,677,225 B1 | 1/2004 | Ellis et al. | |
| 6,680,792 B2 | 1/2004 | Miles | |
| 6,713,235 B1 | 3/2004 | Ide et al. | |
| 6,778,306 B2 | 8/2004 | Sniegowski et al. | |
| 6,788,175 B1 | 9/2004 | Prophet | |
| 6,794,119 B2 | 9/2004 | Miles | |
| 6,867,896 B2 | 3/2005 | Miles | |
| 6,882,458 B2 | 4/2005 | Lin et al. | |
| 6,967,757 B1 | 11/2005 | Allen et al. | |
| 6,987,432 B2 | 1/2006 | Lutz et al. | |
| 6,995,890 B2 | 2/2006 | Lin | |
| 7,016,099 B2 | 3/2006 | Ikeda et al. | |
| 7,078,293 B2 | 7/2006 | Lin et al. | |
| 7,123,216 B1 | 10/2006 | Miles | |
| 7,198,973 B2 | 4/2007 | Lin et al. | |
| 7,250,315 B2 | 7/2007 | Miles | |
| 7,291,921 B2 | 11/2007 | Lin | |
| 2001/0040675 A1 | 11/2001 | True et al. | |
| 2002/0027636 A1 | 3/2002 | Yamada | |
| 2002/0054422 A1 | 5/2002 | Carr et al. | |
| 2002/0058422 A1 | 5/2002 | Jang et al. | |
| 2002/0071169 A1 | 6/2002 | Bowers et al. | |
| 2002/0110948 A1 | 8/2002 | Huang et al. | |
| 2002/0117728 A1 | 8/2002 | Brosnihan et al. | |
| 2002/0146200 A1 | 10/2002 | Kudrle et al. | |
| 2002/0186483 A1 | 12/2002 | Hagelin et al. | |
| 2003/0016428 A1 | 1/2003 | Kato et al. | |
| 2003/0053078 A1 | 3/2003 | Missey et al. | |
| 2003/0053233 A1 | 3/2003 | Felton | |
| 2003/0123126 A1 | 7/2003 | Meyer et al. | |
| 2003/0210851 A1 | 11/2003 | Fu et al. | |
| 2003/0231373 A1 | 12/2003 | Kowarz et al. | |
| 2004/0027671 A1 | 2/2004 | Wu et al. | |
| 2004/0035821 A1 | 2/2004 | Doan et al. | |
| 2004/0051929 A1 | 3/2004 | Sampsell et al. | |
| 2004/0100680 A1 | 5/2004 | Huibers et al. | |
| 2004/0125347 A1 | 7/2004 | Patel et al. | |
| 2004/0136045 A1 | 7/2004 | Tran | |
| 2004/0207898 A1 | 10/2004 | Lin et al. | |
| 2004/0209195 A1 | 10/2004 | Lin | |
| 2005/0024557 A1 | 2/2005 | Lin | |
| 2005/0036095 A1 | 2/2005 | Yeh et al. | |
| 2006/0006138 A1 | 1/2006 | Lin | |
| 2006/0256420 A1 | 11/2006 | Miles et al. | |
| 2007/0269748 A1 | 11/2007 | Miles | |
| 2008/0068699 A1 | 3/2008 | Miles | |

FOREIGN PATENT DOCUMENTS

| | | |
|---|---|---|
| DE | 198 47 455 | 4/2004 |
| EP | 0 069 226 | 1/1983 |
| EP | 0 695 959 | 2/1996 |
| EP | 0 788 005 | 8/1997 |
| EP | 1 275 997 | 1/2003 |
| JP | 9-127439 | 5/1997 |
| JP | 11-097799 | 4/1999 |
| JP | 11-243214 | 9/1999 |
| JP | 2001-085519 | 3/2001 |
| JP | 2002-062490 | 2/2002 |
| JP | 2002-207182 | 7/2002 |
| JP | 2002-355800 | 12/2002 |
| WO | WO 02/079853 | 10/2002 |
| WO | WO 03/014789 | 2/2003 |
| WO | WO 2004/015741 | 2/2004 |

OTHER PUBLICATIONS

Raley et al., "A Fabry-Perot Microinterferometer for Visible Wavelengths," IEEE Solid-State Sensor and Actuator Workshop, Hilton Head, SC, pp. 170-173(1992).

Wang et al., Flexible curcuit-based RF MEMS Switches, Proceedings of 2001 ASME International Mechanical Engineering Congress and Exposition, pp. 1-6, 2001.

Office Action dated Mar. 22, 2007 in U.S. Appl. No. 10/810,660.

Office Action dated Oct. 18, 2006 in U.S. Appl. No. 10/810,660.

Office Action dated Jun. 6, 2006, in U.S. Appl. No. 10/810,660.

Office Action dated Feb. 2, 2006 in U.S. Appl. No. 10/810,660.

Office Action dated Jun. 9, 2006 in Chinese App. No. 200310102876. 9.

Official Action dated Nov. 21, 2006 in Japanese App. No. 2004-102022.

Notice to Submit a Response dated Oct. 12, 2005 in Korean App. No. 10-2004-0025015.

Final Office Aciton dated May 29, 2006 in Korean App. No. 10-2004-0025015.

Dai et al., "A CMOS surface micromachined pressure sensor," Journal of the Chinese institute of Engineers, 1999, vol. 22, No. 3 (May), pp. 375-380.

STRUCTURE OF A MICRO ELECTRO MECHANICAL SYSTEM AND THE MANUFACTURING METHOD THEREOF

RELATED APPLICATION

This application is a continuation of U.S. application Ser. No. 10/810,660, filed Mar. 29, 2004, which is incorporated herein by reference in its entirety.

FIELD OF THE INVENTION

The present invention relates to a structure of an optical interference display cell and the manufacturing method thereof, and more particularly, to the structure of a movable electrode in an optical interference display cell and the manufacturing method.

BACKGROUND OF THE INVENTION

In a micro electro mechanical system (MEMS), the development of a sacrificial layer technique has become a key factor for manufacturing a suspended structure, such as a cantilever, a beam, a membrane, a channel, a cavity, a joint or hinge, a link, a crank, a gear or a rack, to name a few. A structure release etching process is adapted for removing a sacrificial layer, so a structure of a structure release in a micro electro mechanical system has a critical influence on the process of removing the sacrificial layer.

A conventional structure release etching process is first introduced with an optical interference display cell as an example. The optical interference display cell, a kind of a micro electro mechanical system, is used to fabricate a planar display. Planar displays are popular for portable displays and displays with space limits because they are light and small in size. To date, planar displays in addition to liquid crystal displays (LCD), organic electro-luminescent displays (OLED), plasma display panels (PDP), a mode of optical interference displays is another option for planar displays.

U.S. Pat. No. 5,835,255 discloses an array of display units of visible light that can be used in a planar display. Please refer to FIG. 1, which depicts a cross-sectional view of a display unit in the prior art. Every optical interference display unit 100 comprises two walls, 102 and 104. Posts 106 support these two walls 102 and 104, and a cavity 108 is subsequently formed. The distance between these two walls 102 and 104, that is, the length of the cavity 108, is D. One of the walls 102 and 104 is a hemi-transmissible/hemi-reflective layer with an absorption rate that partially absorbs visible light, and the other is a light reflective layer that is deformable when voltage is applied. When the incident light passes through the wall 102 or 104 and arrives in the cavity 108, in all visible light spectra, only the visible light with the wavelength corresponding to the formula 1.1 can generate a constructive interference and can be emitted, that is, $$2D = N\lambda \quad (1.1)$$

, where N is a natural number.

When the length D of cavity 108 is equal to half of the wavelength times any natural number, a constructive interference is generated and a sharp light wave is emitted. In the meantime, if the observer follows the direction of the incident light, a reflected light with wavelength $\lambda 1$ can be observed. Therefore, the display unit 100 is "open".

FIG. 2 depicts a cross-sectional view of a display unit in the prior art after applying a voltage. As shown in FIG. 2, while driven by the voltage, the wall 104 is deformed and falls down towards the wall 102 due to the attraction of static electricity. At this time, the distance between wall 102 and 104, that is, the length of the cavity 108 is not exactly zero, but is d, which can be zero. If we use d instead of D in formula 1.1, only the visible light with a wavelength satisfying formula 1.1, which is $\lambda 2$, can generate a constructive interference, and be reflected by the wall 104, and pass through the wall 102. Because wall 102 has a high light absorption rate for light with wavelength $\lambda 2$, all the incident light in the visible light spectrum is filtered out and an observer who follows the direction of the incident light cannot observe any reflected light in the visible light spectrum. The display unit 100 is now "closed".

FIG. 3A to FIG. 3B illustrate a method for manufacturing a conventional display cell. Referring to FIG. 3A, a first electrode 110 and a sacrificial layer 111 are formed in sequence on a transparent substrate 109, and opening 112, which is suitable for forming a supporter therein, is formed in the first electrode 110 and the sacrificial layer 111. Then, a supporter 106 is formed in the opening 112. Next, an electrode 114 is formed on the sacrificial layer 111 and the supporter 106. Subsequently, referring to FIG. 3B, the sacrificial layer 111 shown in FIG. 3A is removed by a release etching process to form a cavity 116, which is located in the position of the sacrificial layer 111, and the length D of the cavity 116 is the thickness of the sacrificial layer 111.

In a micro electro mechanical process, a micro suspended structure is fabricated by using a sacrificial layer. A suspended movable microstructure is fabricated by a selective etching between a device structure layer and the sacrificial layer to remove the sacrificial layer and leave the structure layer, and this process is called a structure release etching. The difference between the structure release etching process and an IC process is that in the structure release etching process, the selective etching is an isotropic etching, so that an undercut or an under etching is formed in the structure layer for smooth separation of the structure layer and the substrate.

No matter the wet structure release process or the dry structure release process is used, the choices of the material of the sacrificial layer and the micro suspended structure should be restricted, that is, the material used should have high etching-selectivity in the etching process or else the goal of removing the sacrificial layer without etching the micro suspended structure can not be achieved. Therefore, it is impossible to use the same material in both sacrificial layer and the micro suspended structure in the present process.

In the process of the optical interference display cell, some materials, such as molybdenum, are very suitable to form the sacrificial layer and the movable electrodes. However, in the structure and the process of the conventional optical interference display cell, molybdenum cannot be the material of forming both sacrificial layer and the micro suspended structure at the same time. Thus results in enormous limits in choosing the materials.

Furthermore, the aforementioned movable electrode is generally a membrane that is usually metal. The thickness of the movable electrode is so small that the quality of the metal membrane is easily worsen because of the oxidation caused by the contact with air or moisture. Thus would affect the optical interference display cell. Accordingly, how to provide a new structure and the manufacturing method thereof of an optical interference display cell to broaden the choices of process materials and to protect the movable electrode from the oxidation caused by the air or moisture has become a very important issue.

SUMMARY OF THE INVENTION

Hence, an object of the present invention is to provide a structure of a micro electro mechanical system, suitable in an optical interference display cell, wherein the materials of the sacrificial layer and the suspended movable micro structure are not needed to restrict in the materials with high etching selectivity.

An alternative objective of the present invention is to provide a structure of a micro electro mechanical system, suitable in an optical interference display cell, wherein a protection layer is added between the sacrificial layer and the suspended movable micro structure and the materials of forming the protection layer and the sacrificial layer have high etching selectivity.

Another objective of the present invention is to provide a structure of a micro electro mechanical system, suitable in an optical interference display cell, wherein the materials of the sacrificial layer and the suspended movable microstructure are the same.

Still another objective of the present invention is to provide a structure of a micro electro mechanical system, suitable in an optical interference display cell, wherein the materials of the sacrificial layer and the suspended movable microstructure can be the materials with not-high etching selectivity.

Still another objective of the present invention is to provide a structure of a micro electro mechanical system, suitable in an optical interference display cell, wherein a protection layer covers the suspended movable microstructure and the materials of forming the protection layer and the sacrificial layer have high etching selectivity and will protect the suspended movable microstructure from the etching of the air and moisture.

Still another objective of the present invention is to provide a structure of a micro electro mechanical system suitable in an optical interference display cell and suitable to manufacture the structure of a micro electro mechanical system with the aforementioned protection layer.

According to the aforementioned objectives, in one preferred embodiment of the present invention, an optical interference display cell is taken as an example to explain how the present invention is used on the structure of a micro electro mechanical system. An optical interference display cell comprises a first electrode and a second electrode, and there are a supporter and a sacrificial layer therein, wherein the second electrode is movable. There is a protection layer between the second electrode and the sacrificial layer. The materials used in the sacrificial layer and the protection layer have high etching selectivity. There are no limits in choosing the materials used in the sacrificial layer and the second electrode, but the material of the second electrode needs to be a conductor.

In the process of removing the sacrificial layer through a structure release etch process, the etching plasma has high selectivity in the sacrificial layer and the protection layer, so only the sacrificial layer will be removed. Hence, there are no limits in choosing the materials used in the sacrificial layer and the second electrode.

According to the aforementioned objectives of the present invention, in another preferred embodiment of the present invention, another optical interference display cell is taken as an example that a protection layer is used to cover a suspended movable micro structure (a movable electrode). The materials of forming the protection layer and the sacrificial layer have high etching selectivity and will protect the suspended movable microstructure from the etching of the air and moisture. An optical interference display cell comprises a first electrode and a second electrode, and there are a supporter and a sacrificial layer therein, wherein the second electrode is movable. A protection layer covers the second electrode. The materials used in the sacrificial layer and the protection layer have high etching selectivity. There are no limits in choosing the materials used in the sacrificial layer and the second electrode, but the material of the second electrode needs to be a conductor.

In the process of removing the sacrificial layer through a structure release etch process, the etching plasma has high selectivity in the sacrificial layer and the protection layer, so only the sacrificial layer will be removed. Hence, there are no limits in choosing the materials used in the sacrificial layer and the second electrode. Besides, the protection layer covers the second electrode and keeps it from exposing to the air, and further avoids the second electrode from the damage of the oxygen and moisture in the air.

According to the structure of a micro electro mechanical system and the manufacturing method thereof disclosed in the present invention, the choosing of the materials used in the protection layer between the second electrode and the sacrificial layer are not restricted in the materials of high etching selectivity, and the protection layer covering or wrapping the second electrode will protect the second electrode from the damage of the oxygen and moisture in the air.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, where.

DETAILED DESCRIPTION OF THE PREFERRED EMBODIMENT

In order to make the illustration of a structure of a micro electro mechanical system and a method for manufacturing the same provided in the present invention more clear, an embodiment of the present invention herein takes an optical interference display cell structure and a manufacturing method thereof for example, to illustrate how to apply the structure of the structure release and the method for manufacturing the same disclosed in the present invention, and to further explain advantages of the present invention according to the disclosure of the embodiment.

The First Embodiment

Figure 1:
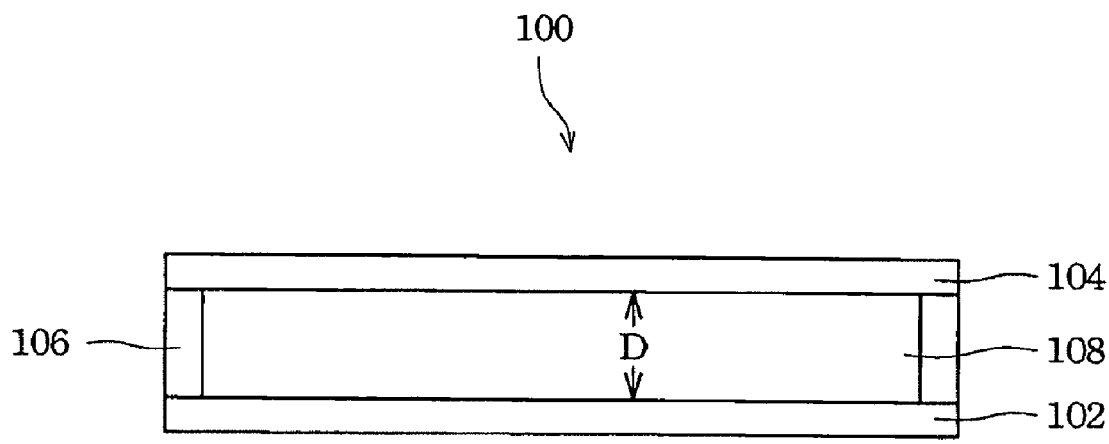
FIG. 1 illustrates a cross-sectional view of a conventional display cell.
Figure 2:
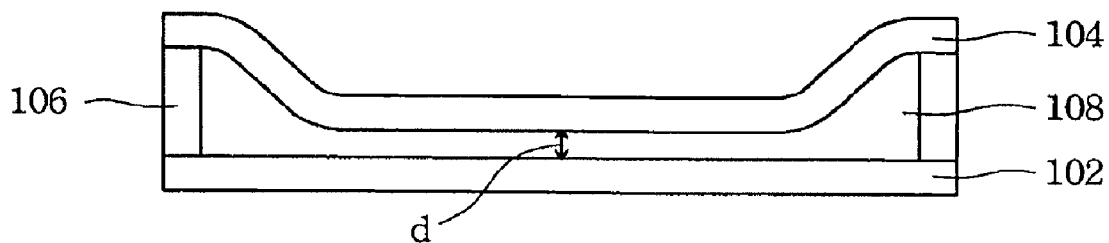
FIG. 2 illustrates a cross-sectional view of a conventional display cell after a voltage is applied.
Figure 3A:
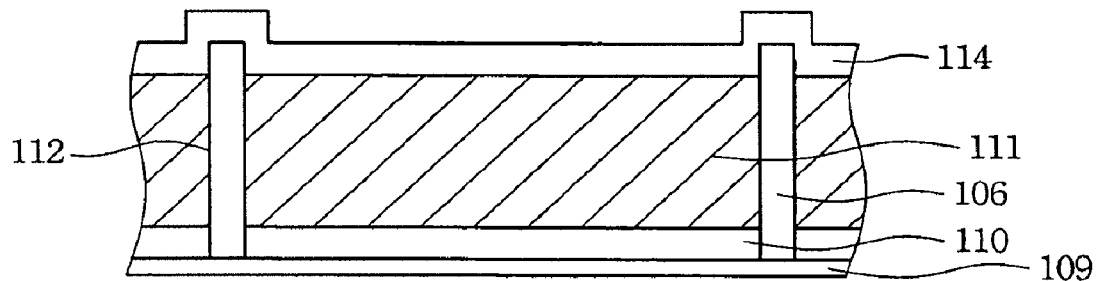
FIG. 3A to FIG. 3B illustrates a method for manufacturing a conventional display cell.
Figure 3B:
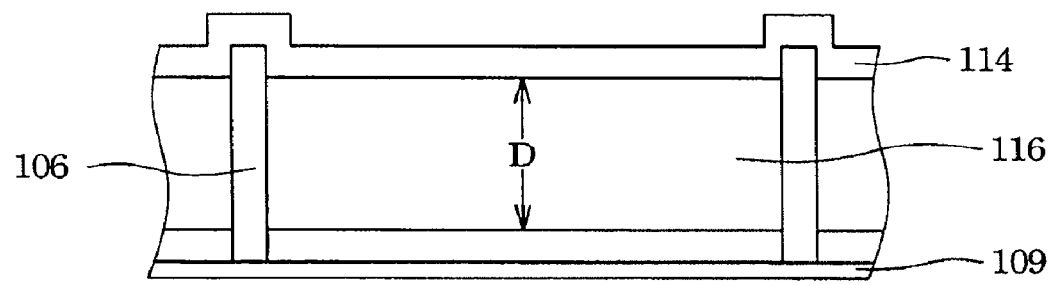
Figure 4A:
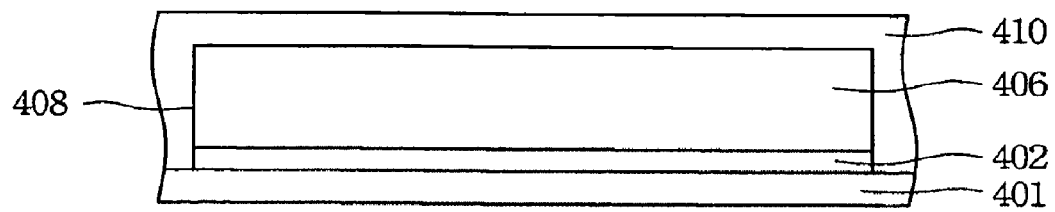
FIG. 4A to FIG. 4C illustrates a method for manufacturing an optical interference display cell structure in accordance with the first embodiment of the present invention.
Figure 4B:
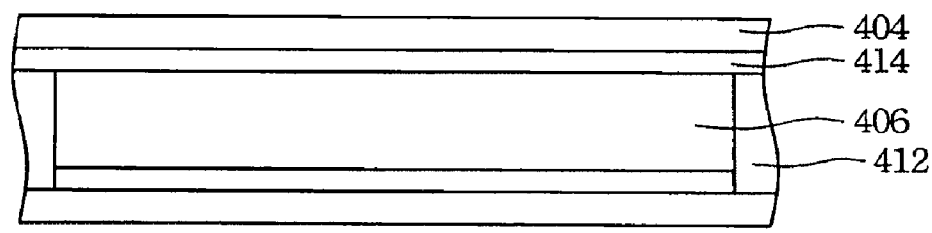
Figure 4C:
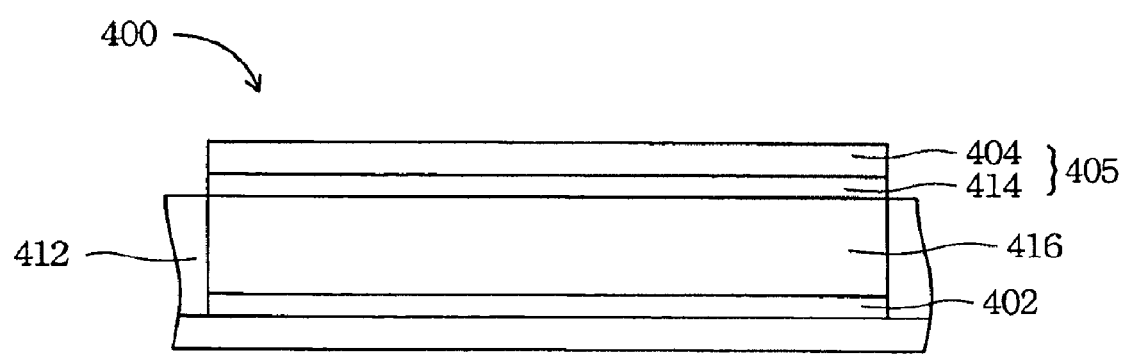

FIG. 4A to FIG. 4C illustrates a method for manufacturing an optical interference display cell structure in accordance with an embodiment of the present invention. Please referring to FIG. 4A, a first electrode 402 and a sacrificial layer 406 are formed on a transparent substrate 401 in sequence. The material of the sacrificial layer 406 can be transparent material, such as dielectric material, or opaque material, such as metal material. The opening 408, suitable for forming a supporter therein, is formed in the first electrode 402 and the sacrificial layer 406 by a photolithography process.

Then, a material layer 410 is formed on the sacrificial layer 406 to fill up the opening 408. The material layer 410 is suitable for forming the supporter, and the material layer 410 is generally made of photosensitive materials such as photoresists, or non-photosensitive polymer materials such as polyester, polyamide etc. If non-photosensitive materials are used for forming the material layer 410, a photolithographic etching process is required to define supporters in the material layer 410. In this embodiment, the photosensitive materials are used for forming the material layer 410, so merely a photolithography process is required for patterning the material layer 410. In the embodiment, the materials suitable for forming the material layer 410 comprise positive photoresists, negative photoresists, and all kinds of polymers, such as acrylic resins, epoxy resins etc.

Please referring to FIG. 4B, supporters 412 are defined by patterning the material layer 410 through a photolithography process. Next, a material layer 414 is formed on the sacrificial layer 406 and the supporters 412. Then, a conductor layer 404 is formed on the material layer 414. The materials used in the material layer 414 and the sacrificial layer 406 have high etching selectivity. While the sacrificial layer 406 uses metal material, the material layer 414 uses dielectric material, such as silicon oxide, silicon nitride, or transparent conductor material, such as indium tin oxide (ITO), indium zinc oxide (IZO), indium oxide (IO), or macromolecule polymer. While the sacrificial layer 406 uses silicon material, such as polysilicon or amorphous silicon, the material layer 414 uses metal silicon oxide, or macromolecule polymer.

Please refer to FIG. 4C. The conductor layer 404 and the material layer 414 not yet covered by a photoresist layer (not shown in the drawing) is etched through a photolithography process and the second electrode 405 of every optical interference display cell is defined, wherein the second electrode 405 is movable. Finally, the sacrificial layer is removed through a structure release etch process, and a cavity 416 is formed. The material layer 414 is a protection layer. While the material of the material layer 414 is conductor material, it can also be the conductor part of the second electrode 405.

The optical interference display cell manufactured through the aforementioned process is illustrated in FIG. 4C. An optical interference display cell 400, which can be a color-changeable pixel unit, comprises a first electrode 402 and a second electrode 405, wherein the first electrode 402 and the second electrode 405 are set approximately in parallel. The first electrode 402 and the second electrode 405 are chosen from the group consisting of narrowband mirrors, broadband mirrors, non-metal mirrors, metal mirrors and any arbitrary combination thereof.

The supporters 412 support the first electrode 402 and the second electrode 405, and a cavity 416 is formed therein. The second electrode 405 comprises the conductor layer 404 and the material layer 414. The length of the cavity in the conventional optical interference display cell is the thick of the sacrificial layer, and the sacrificial layer is removed through a structure release process and then the cavity 416 is formed. In the embodiment, the material layer 414 of the second electrode 405 can protect the conductor layer 404 in the structure release process from the injury of the etching reagent. Therefore, when choosing the materials for the sacrificial layer and the second electrode, there is no need to restrict the material within the material with high etching selectivity. Hence, the chosen in materials is broader.

The Second Embodiment

FIG. 5A to FIG. 5D illustrate a method for manufacturing an optical interference display cell structure in accordance with an alternative embodiment of the present invention. Please referring to FIG. 5A, a first electrode 502 and a sacrificial layer 506 are formed on a transparent substrate 501 in sequence. The material of the sacrificial layer 506 can be transparent material, such as dielectric material, or opaque material, such as metal material. The opening 508, suitable for forming a supporter therein, is formed in the first electrode 502 and the sacrificial layer 506 by a photolithography process.

Then, a material layer 510 is formed on the sacrificial layer 506 to fill up the opening 508. The material layer 510 is suitable for forming the supporter, and the material layer is generally made of photosensitive materials such as photoresists, or non-photosensitive polymer materials such as polyester, polyamide etc. If non-photosensitive materials are used for forming the material layer, a photolithographic etching process is required to define supporters in the material layer 510. In this embodiment, the photosensitive materials are used for forming the material layer 510, so merely a photolithography process is required for patterning the material layer 510. In the embodiment, the materials suitable for forming the material layer 510 comprise positive photoresists, negative photoresists, and all kinds of polymers, such as acrylic resins, epoxy resins etc.

Figure 5A:
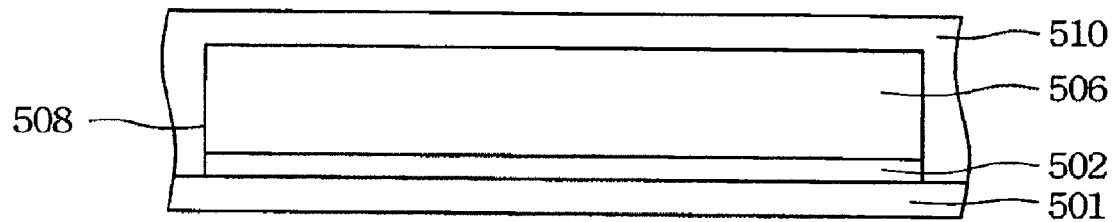
FIG. 5A to FIG. 5D illustrates a method for manufacturing an optical interference display cell structure in accordance with the second embodiment of the present invention; and FIG. 6A to FIG. 6D illustrates a method for manufacturing an optical interference display cell structure in accordance with the third embodiment of the present invention.
Figure 5B:
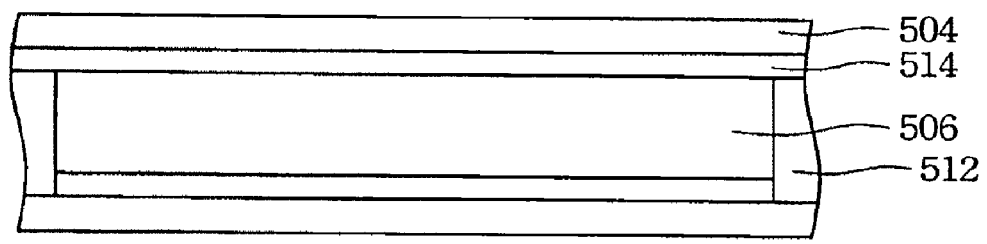

Please referring to FIG. 5B, supporters 512 are defined by patterning the material layer 510 through a photolithography process. Next, a material layer 514 is formed on the sacrificial layer 506 and the supporters 512. Then, a conductor layer 504 is formed on the material layer 514. The materials used in the material layer 514 and the sacrificial layer 506 have high etching selectivity. While the sacrificial layer 506 uses metal material, the material layer 514 uses dielectric material, such as silicon oxide, silicon nitride, or transparent conductor material, such as indium tin oxide (ITO), indium zinc oxide (IZO), indium oxide (IO), or macromolecule polymer. While the sacrificial layer 506 uses silicon material, such as polysilicon or amorphous silicon, the material layer 514 uses metal silicon oxide, or macromolecule polymer.

Figure 5C:
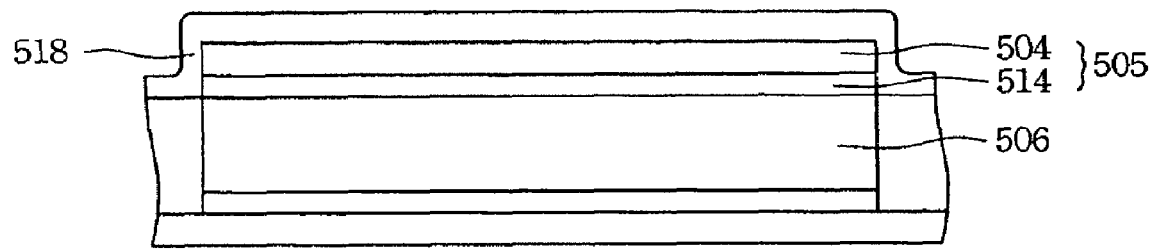

Please refer to FIG. 5C. The conductor layer 504 and the material layer 514 not yet covered by a photoresist layer (not shown in the drawing) is etched through a photolithography process and the second electrode 505 of every optical interference display cell is defined, wherein the second electrode 505 is movable. Next, a material layer 518 is formed to cover the second electrode 504. The material forming the material layer 518 is selected from the group comprising silicon material, dielectric material, transparent conductor, macromolecule polymer or metal oxide, wherein the silicon material can be poly-silicon or amorphous silicon, such as silicon oxide, silicon nitride, silicon oxynitride or transparent conductor material, such as indium tin oxide (ITO), indium zinc oxide (IZO), indium oxide (IO), or macromolecule polymer, such as paraffin or macromolecule material which can be coated by vapor. The material layer 514 and 518 are protection layers. While the materials of the material layer 514 and 518 are conductor material, they can also be the conductor parts of the second electrode 505.

Figure 5D:
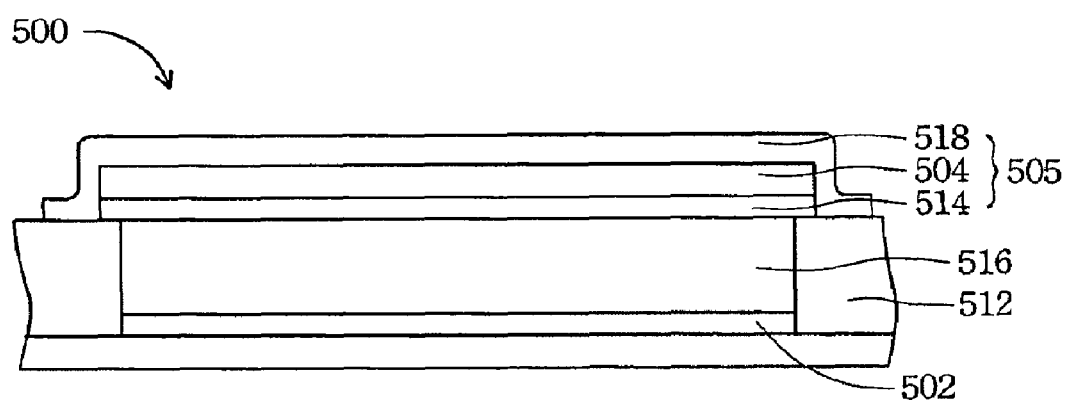

Please refer to FIG. 5D. Through a photolithography process, the material layer 518 is patterned and part of the material layer 518 on the supporters 512 is removed. It is to achieve the goal that the sacrificial layer 506 as shown in FIG. 5C can be laterally etching through the openings by the etching reagent in the following structure release etch process. Finally, the sacrificial layer is removed through the structure release etch process, and a cavity 516 is formed.

The optical interference display cell manufactured through the aforementioned process is illustrated in FIG. 5C. An optical interference display cell 500, which can be a color-changeable pixel unit, comprises a first electrode 502 and a second electrode 505, wherein the first electrode 502 and the second electrode SOS are set approximately in parallel. The first electrode 502 and the second electrode SOS are chosen from the group consisting of narrowband mirrors, broadband mirrors, non-metal mirrors, metal mirrors and any arbitrary combination thereof.

The supporters 512 support the first electrode 502 and the second electrode 505 and a cavity 516 is formed therein. The second electrode 505 comprises the conductor layer 504, the material layer 514 and the material layer 518, wherein the material layer 514 and the material layer 518 cover the conductor layer 504. The length of the cavity in the conventional optical interference display cell is the thick of the sacrificial layer, and the sacrificial layer is removed through a structure release process and then the cavity 516 is formed. In this embodiment, the material layer 518 and the material layer 514 of the conductor layer 504 of the second electrode 505 can protect the conductor layer 504 in the structure release process from the injury of the etching reagent. Therefore, when choosing the materials for the sacrificial layer and the second electrode, there is no need to restrict the material within the material with high etching selectivity. Hence, the chosen in materials is broader. Besides, the material layer 514 and the material layer 518 will further protect the conductor layer 504 from the oxidation and etching of the oxygen and the moisture in the air.

The Third Embodiment

FIG. 6A to FIG. 6D illustrate a method for manufacturing an optical interference display cell structure in accordance with another embodiment of the present invention. Please referring to FIG. 6A, a first electrode 602 and a sacrificial layer 606 are formed on a transparent substrate 601 in sequence. The material of the sacrificial layer 606 can be transparent material, such as dielectric material, or opaque material, such as metal material. The opening 608, suitable for forming a supporter therein, is formed in the first electrode 602 and the sacrificial layer 606 by a photolithography process.

Then, a material layer 610 is formed on the sacrificial layer 606 to fill up the opening 608. The material layer 610 is suitable for forming the supporter, and the material layer is generally made of photosensitive materials such as photoresists, or non-photosensitive polymer materials such as polyester, polyamide etc. If non-photosensitive materials are used for forming the material layer, a photolithographic etching process is required to define supporters in the material layer 610. In this embodiment, the photosensitive materials are used for forming the material layer 610, so merely a photolithography process is required for patterning the material layer 610. In the embodiment, the materials suitable for forming the material layer 610 comprise positive photoresists, negative photoresists, and all kinds of polymers, such as acrylic resins, epoxy resins etc.

Figure 6A:
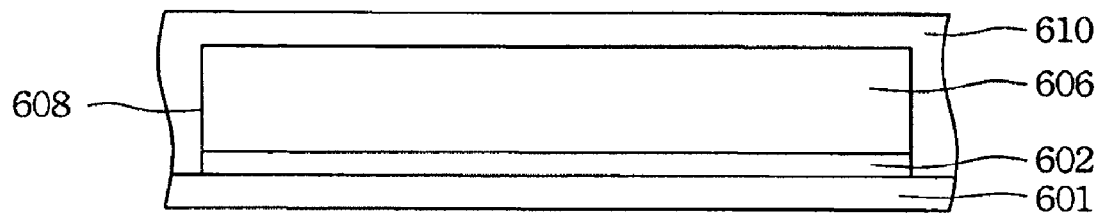
Figure 6B:
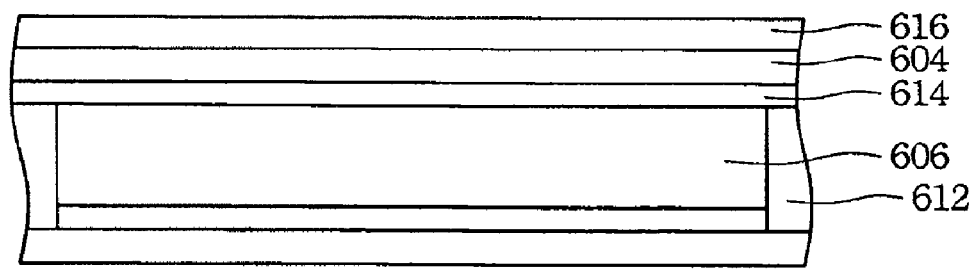

Please referring to FIG. 6B, supporters 612 are defined by patterning the material layer 610 through a photolithography process. Next, a material layer 614 is formed on the sacrificial layer 606 and the supporters 612. Then, a conductor layer 604 and a material layer 616 are formed in order on the material layer 614. The materials used in the material layer 614 and the material layer 616 and the material used in the sacrificial layer 606 have high etching selectivity. While the sacrificial layer 506 uses metal material, the material layer 614 and the material layer 616 use dielectric material, such as silicon oxide, silicon nitride, silicon oxynitride, or transparent conductor material, such as indium tin oxide (ITO), indium zinc oxide (IZO), indium oxide (IO), or macromolecule polymer, such as paraffin or macromolecule material which can be coated by vapor. While the sacrificial layer 606 uses silicon material, such as poly-silicon or amorphous silicon, the material layer 614 and the material layer 616 use metal silicon oxide, or macromolecule polymer.

Figure 6C:
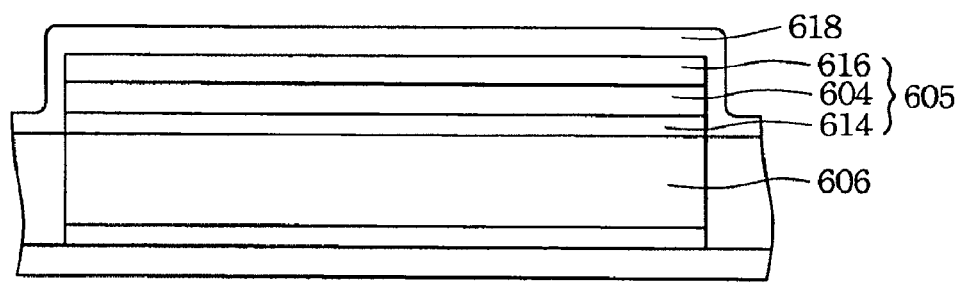

Please refer to FIG. 6C. The conductor layer 604, the material layer 614 and the material layer 616 not yet covered by a photoresist layer (not shown in the drawing) are etched through a photolithography process and the second electrode 605 of every optical interference display cell is defined, wherein the second electrode 605 is movable. Next, a material layer 618 is formed to cover the conductor layer 604, the material layer 614 and the material layer 616. The material forming the material layer 618 is selected from the group comprising silicon material, dielectric material, transparent conductor, macromolecule polymer or metal oxide, wherein the silicon material can be poly-silicon or amorphous silicon, such as silicon oxide, silicon nitride, silicon oxynitride or transparent conductor material, such as indium tin oxide (ITO), indium zinc oxide (IZO), indium oxide (IO), or macromolecule polymer, such as paraffin or macromolecule material which can be coated by vapor.

Figure 6D:
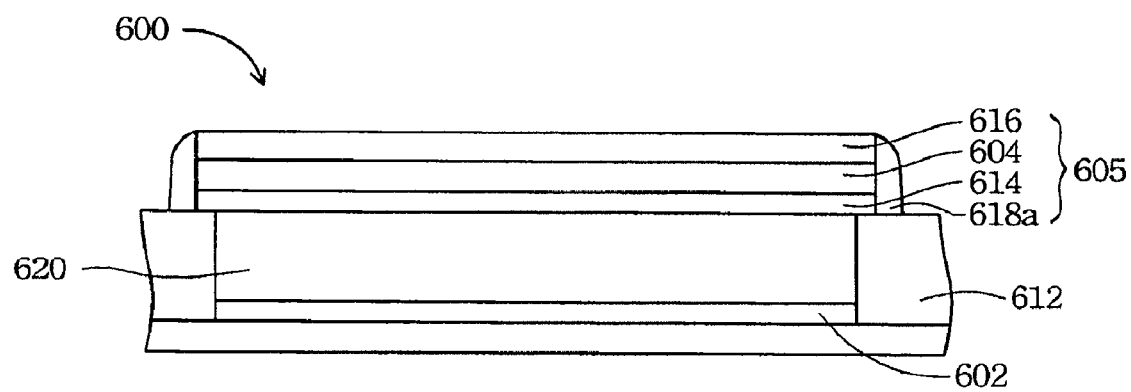

Please refer to FIG. 6D. The material layer 618 is etched through a self-aligned etching process. The spacer 618a is formed on the sidewalls of the second electrode 604, and the sacrificial layer 606 under the material layer 614 is exposed. Finally, the sacrificial layer is removed through the structure release etch process, and a cavity 616 is formed. The material layer 614, the material layer 616 and the spacer 618a are protection layers. While the materials of the material layer 614, the material layer 616 and the spacer 618a are conductor materials, they can also be the conductor parts of the second electrode 605.

The optical interference display cell manufactured through the aforementioned process is illustrated in FIG. 6C. An optical interference display cell 600, which can be a color-changeable pixel unit, comprises a first electrode 602 and a second electrode 605, wherein the first electrode 602 and the second electrode 605 are set approximately in parallel. The first electrode 602 and the second electrode 605 are chosen from the group consisting of narrowband mirrors, broadband mirrors, non-metal mirrors, metal mirrors and any arbitrary combination thereof.

The supporters 612 support the first electrode 602 and the second electrode 605 and a cavity 620 is formed therein. The second electrode 605 comprises the conductor layer 604, the material layer 614, the material layer 616 and the spacer 618a, wherein the conductor layer 604 is covered by the material layer 614, the material layer 616 and the spacer 618a. The length of the cavity in the conventional optical interference display cell is the thick of the sacrificial layer, and the sacrificial layer is removed through a structure release process and then the cavity 620 is formed. In this embodiment, the material layer 618, the material layer 614 and the spacer 618a of the conductor layer 604 and the side walls can protect the conductor layer 604 of the second electrode 605 in the structure release process from the injury of the etching reagent. Therefore, when choosing the materials for the sacrificial layer and the second electrode, there is no need to restrict the material within the material with high etching selectivity. Hence, the chosen in materials is broader. Besides, the material layer 614, the material layer 618 and the spacer 618a will further protect the conductor layer 604 from the oxidation and etching of the oxygen and the moisture in the air.

The manufacturing method of the optical interference display cell disclosed in the third embodiment has another advantage that only one mask is needed to produce the second electrode. The decrease of one mask not only accelerates the process but also decreases the cost.

The thick of the material layer used to protect the suspended movable microstructure disclosed in the present invention is decided according to the demands. There are also no limits in the thick of the material layer used to protect the suspended movable microstructure in the two embodiments. It depends on the size of the optical interference display cell. Generally speaking, the thick of the material layer in the embodiments of the present invention is about several angstroms to 2000 angstrom, preferably about 200 angstrom to 1000 angstrom.

As is understood by a person skilled in the art, the foregoing embodiments of the present invention are illustrative of the present invention rather than limiting of the present invention. The structure of a micro electro mechanical system and the method for manufacturing the same disclosed in the present invention can be applied in various micro electro mechanical structure systems. It is intended that various modifications and similar arrangements be included within the spirit and scope of the appended claims, the scope of which should be accorded the broadest interpretation so as to encompass all such modifications and similar structure.

What is claimed is:

1. A pre-release structure configured to form an optical interference display cell upon removal of a sacrificial layer, the pre-release structure comprising:
    a first electrode;
    a sacrificial layer;
    a first material layer; and
    a conductor layer comprising a light reflective surface;
    wherein:
        the sacrificial layer is positioned between the first electrode and the first material layer;
        the first material layer is positioned between the sacrificial layer and the conductor layer;
        the conductor layer is susceptible to etching by an etchant suitable to remove the sacrificial layer;
        the first material layer is adapted to protect the light reflective layer from etching when the sacrificial layer is removed using the etchant; and
        the optical interference display cell formed after removal of the sacrificial layer is configured to interferometrically reflect light contacting the light reflective surface.

2. The pre-release structure of claim 1, wherein the first electrode is selected from the group consisting of a narrowband mirror, a broadband mirror, a non-metal mirror, a metal mirror, and any arbitrary combination thereof.

3. The pre-release structure of claim 1, wherein the first electrode is a metal.

4. The pre-release structure of claim 1, wherein the first electrode is a non-metal.

5. The pre-release structure of claim 1, wherein the conductor layer is selected from the group consisting of a narrowband mirror, a broadband mirror, a non-metal mirror, a metal mirror, and any arbitrary combination thereof.

6. The pre-release structure of claim 1, wherein the conductor layer is a metal.

7. The pre-release structure of claim 1, wherein the conductor layer is a non-metal.

8. The pre-release structure of claim 1, wherein the sacrificial layer comprises a metal material or a silicon material.

9. The pre-release structure of claim 8, wherein the sacrificial layer comprises amorphous silicon.

10. The pre-release structure of claim 8, wherein the sacrificial layer comprises poly-silicon.

11. The pre-release structure of claim 1, wherein the first material layer is selected from the group consisting of a silicon material, a dielectric material, a transparent conductor material, a macromolecule polymer, a metal oxide, and any arbitrary combination thereof.

12. The pre-release structure of claim 11, wherein the first material layer is a silicon material.

13. The pre-release structure of claim 12, wherein the first material layer is poly-silicon or amorphous silicon.

14. The pre-release structure of claim 12, wherein the first material layer is silicon oxide.

15. The pre-release structure of claim 12, wherein the first material layer is silicon nitride.

16. The pre-release structure of claim 1, wherein the thickness of the first material layer is about several angstroms to 2000 angstrom.

17. The pre-release structure of claim 1, wherein the thickness of the first material layer is about 200 angstrom to 1000 angstrom.

18. The pre-release structure of claim 1, further comprising a second material layer, wherein the conductor layer is positioned between the first material layer and the second material layer.

19. The prelease structure of claim 18, wherein the second material layer is selected from the group consisting of a silicon material, a dielectric material, a transparent conductor material, a macromolecule polymer, a metal oxide, and any arbitrary combination thereof.

20. The pre-release structure of claim 1, further comprising a supporter configured to separate the first electrode from the first material layer to form a cavity upon structure release etching.

21. The pre-release structure of claim 19, wherein the supporter is selected from the group consisting of a silicon material, a dielectric material, a transparent conductor material, a macromolecule polymer, a metal oxide, and any arbitrary combination thereof.

22. The pre-release structure of claim 20, wherein the supporter is selected from the group consisting of positive photoresists, negative photoresists, acrylic resins, and epoxy resins.

* * * * *

UNITED STATES PATENT AND TRADEMARK OFFICE
CERTIFICATE OF CORRECTION

PATENT NO. : 7,709,964 B2  Page 1 of 1
APPLICATION NO. : 11/925551
DATED : May 4, 2010
INVENTOR(S) : Wen-Jian Lin It is certified that error appears in the above-identified patent and that said Letters Patent is hereby corrected as shown below:

On Page 1, Column 1, Line 30 (approx.), Item 30, under Foreign Application Priority Data, please delete "CN" and insert --TW--, therefor.

On Page 2, Column 2, Line 43, Item 56, under Other Publications, please delete "curcuit" and insert --circuit--, therefor.

On Page 2, Column 2, Line 55, Item 56, under Other Publications, please delete "Aciton" and insert --Action--, therefor.

In Column 7, Line 12, please delete "SOS" and insert --505--, therefor.

In Column 7, Line 13, please delete "SOS" and insert --505--, therefor.

In Column 10, Line 42, in Claim 19, please delete "prelease", and insert --pre-release--, therefor.

Signed and Sealed this

Twenty-sixth Day of October, 2010

David J. Kappos
*Director of the United States Patent and Trademark Office*